United States Patent [19]

Chang

[11] Patent Number: 4,544,444

[45] Date of Patent: Oct. 1, 1985

[54] REACTIVE ION ETCHING OF TIN OXIDE FILMS USING SILICON TETRACHLORIDE REACTANT GAS

[75] Inventor: Shih-Chia Chang, Troy, Mich.

[73] Assignee: General Motors Corporation, Detroit, Mich.

[21] Appl. No.: 640,938

[22] Filed: Aug. 15, 1984

[51] Int. Cl.$^4$ .......................... B44C 1/22; C03C 15/00; C03C 25/06
[52] U.S. Cl. ........................ 156/643; 156/646; 156/659.1; 156/667; 204/192 E; 252/79.1
[58] Field of Search ............ 156/643, 646, 653, 655, 156/656, 657, 659.1, 667; 252/79.1; 427/38, 39; 204/164, 192 E

[56] References Cited

U.S. PATENT DOCUMENTS

| | | | |
|---|---|---|---|
| 4,207,137 | 6/1980 | Tretola | 156/627 |
| 4,208,241 | 6/1980 | Harshbarger et al. | 156/643 |
| 4,211,601 | 7/1980 | Mogab | 156/643 |
| 4,226,665 | 10/1980 | Mogab | 156/643 |
| 4,253,907 | 3/1981 | Parry et al. | 156/643 |
| 4,256,534 | 3/1981 | Levinstein et al. | 156/643 |
| 4,259,145 | 3/1981 | Harper et al. | 156/643 |
| 4,277,304 | 7/1981 | Horiike et al. | 156/643 |
| 4,285,763 | 8/1981 | Coldren | 156/643 |
| 4,310,380 | 1/1982 | Flamm et al. | 156/643 |
| 4,312,732 | 1/1982 | Degenkolb et al. | 204/192 E |
| 4,361,461 | 11/1982 | Chang | 156/643 |
| 4,373,990 | 2/1983 | Porter | 156/643 |
| 4,384,938 | 5/1983 | Desilets | 204/298 |
| 4,414,069 | 11/1983 | Cuomo | 204/192 E |
| 4,424,102 | 1/1984 | Brandeis et al. | 204/192 E |

OTHER PUBLICATIONS

Hayashi et al., "Sputter Etching of the SnO$_2$ Film", *Japan J. Appl. Phys.*, vol. 12 (1973), No. 9, p. 1457.
Baliga et al., "Electrochemical Patterning of Tin Oxide Films", *Journal of the Electrochemical Society*, vol. 124, No. 7, pp. 1059-1060, Jul. 1977.
Dionex Gas Plasma Systems Advertising brochure.
*Chemical Abstracts*, Citation 98:64240j, "Microfabrication of Tin Oxide Film", p. 631.
*Chemical Abstracts*, Citation 98:26283t, "Etching of Transparent-Conductor Film", p. 612.
*Chemical Abstracts*, Citation 98:26286w, "Conductive Thin Film", p. 612.
*Chemical Abstracts*, Citation 98:44964v, "Nonisothermal Plasma Etching of Stannic Oxide Films".

*Primary Examiner*—William A. Powell
*Attorney, Agent, or Firm*—Robert J. Wallace

[57] ABSTRACT

High resolution patterns can be etched in tin oxide films in one step using reactive ion etching when the reactant gas consists essentially of silicon tetrachloride (SiCl$_4$).

2 Claims, No Drawings

REACTIVE ION ETCHING OF TIN OXIDE FILMS USING SILICON TETRACHLORIDE REACTANT GAS

FIELD OF THE INVENTION

This invention relates to the etching of tin oxide coatings. More specifically, it relates to reactive ion etching of very high resolution patterns in thin films of tin oxide.

BACKGROUND OF THE INVENTION

Liquid phase, i.e., wet, chemical etching is a typical technique for delineating patterns in blanket coatings. However, where higher resolution patterns are involved, gas phase chemical etching has become of greater interest. Gas phase chemical etching can be accelerated by forming a plasma of the reactant gas at low pressure. However, techniques such as the latter still involve etching by chemical reaction. In addition, if the by-products of the chemical reaction are not volatile under the low pressure conditions, a second etching step may be required to remove them. In some instances one may even need to repeat the first and second steps a multiplicity of times to etch completely through a coating.

Tin oxide is a difficult material to etch. It is resistant to attack by many liquid chemicals, requiring special procedures to etch it. For example, one can etch it with nascent hydrogen that is produced by dissolution of zinc in hydrochloric acid. In such a technique the nascent hydrogen reduces the tin oxide to free tin, which is then removed by reaction with additional hydrochloric acid that is not reacted with the zinc. Such an etching procedure does not produce good resolution and is difficult to control. Electrochemical etching, using a platinum counter-electrode and a hydrochloric acid electrolyte, is generally unsatisfactory in that it has a tendency to leave unetched patches. Sputter etching is not an acceptable alternative because of non-selectivity and low etch rates.

Tin oxide has previously been plasma etched using a hydrogen as the reactant gas. However, the reaction leaves a residue, probably free tin, in the etched areas that has to be etched off with an acid solution. Use of the acid solution, of course, limits the resolution obtainable. A chlorinated gas such as hydrogen chloride or boron trichloride could be substituted for the hydrogen. However, such gases are considered toxic and/or corrosive, and the etching still must be conducted in two steps, as with the hydrogen plasma etching.

On the other hand, I have found that tin oxide can be readily etched in one step by reactive ion etching if the reactant gas consists substantially of argon or nitrogen containing a small proportion of hydrogen. Moreover, this reactant gas is quite selective for tin oxide, in that it does not readily attack commercially available organic resists, as for example, Shipley's AZ 1350 J, Phillip Hunt Chemical Company's HPR204 and Kodak's 747. Further, the etchant gas does not form polymers when used that contaminate the vacuum system. Still further, the reactant gas does not interact with the masking resist in such a way as to make it more difficult to remove after etching is completed. After etching with my technique, resists can be readily removed by conventional techniques, as for example, removal by oxygen plasma or simply by rinsing with acetone. Accordingly, extremely high resolution, i.e., narrow width lines, can be etched. Since my technique does not produce significant undercutting, I refer to my technique as being highly anisotropic in character.

It should also be noted that the improvements of the technique of this invention are quite similar to those of the technique covered by my concurrently filed U.S. patent application Ser. No. 639,853, entitled "Reactive Ion Etching of Tin Oxide Films Using Neutral Reactant Gas Containing Hydrogen" and assigned to the assignee hereof.

OBJECTS AND SUMMARY OF THE INVENTION

It is an object of this invention to provide an improved method for etching tin oxide films.

This invention comprehends using a reactant gas consisting substantially of silicon tetrachloride ($SiCl_4$) for reactive ion etching of tin oxide films. By reactive ion etching, I mean a process of simultaneously not only exposing the tin oxide film to a chemical reaction with plasma of the reactant gas, but also exposing it to a significant ion bombardment, wherein etching is not only due to a chemical interaction with the plasma, but also due to a significant momentum transfer between ions of the plasma and atoms of the film.

DESCRIPTION OF THE PRFERERED EMBODIMENTS

In one specific example of this invention, a 300 nanometer thick tin oxide sputtered film was overcoated with Shipley's resist AZ 1350 J. The resist was exposed and developed to uncover a predetermined surface pattern of the tin oxide. As so prepared, the tin oxide sample was placed on the negative electrode in the etching chamber, or vacuum, of a conventional reactive ion etching apparatus, Model No. MRC V4-8500, which is commercially available from Materials Research Corporation of Orangeburg, N.Y. It should be recognized that the power supply of a reactive ion etching apparatus differs from a plasma etching apparatus. Its rf voltage supply not only provides a significant rf voltage between vacuum chamber electrodes to establish a plasma of the reactant gas, but also to produce a significant DC bias between them. The DC bias is sufficient to accelerate plasma atoms to the surface of the negative electrode, where the sample is supported, with sufficient velocity, to provide a sputtering action at the sample surface in addition to the enhanced chemical reaction activity provided by the plasma itself. The DC bias can be provided by superimposing a DC potential on the rf potential used to form the plasma, or by controlling the rf wave form to yield a net negative potential on the negative electrode.

Except for using my distinctive reactant gas, the reactive ion etching apparatus was operated in accordance with the normal and accepted procedure recommended by the manufacturer. For example, the sample was placed on the negative electrode, or cathode, which was heated to about 50° C. Reactant gas was bled into the etching chamber while it was continuously being pumped out, to dynamically maintain a gas pressure of about 3.3 Pa in the etching chamber. Pressures of 1.33 Pa also have been used. The composition of the reactant gas was 100% by volume silicon tetrachloride ($SiCl_4$).

After the pressure in the chamber stabilized at the desired value, the rf power supply for the apparatus was turned on. It established a plasma adjacent the negative electrode and provided a DC bias of about a −250 volts on the negative electrode at a power density of about 0.33 watts per square centimeter of electrode surface. An etched pattern with a minimum feature size of approximately 1.25 micrometers was produced at an etch rate of about 300 angstroms per minute. Analogous results have been obtained with tin oxide films of other thicknesses and produced by other deposition techniques, as for example, pyrolytic deposition.

I prefer that the reactant gas be 100% by volume silicon tetrachloride. This provides an etch rate that is considerably faster than that obtained by using the hydrogen-neutral ion mixture of my aforementioned U.S. patent application Ser. No. D-7650. Moreover, no polymerization at all has been noticed, not even the minimal type of polymerization which I have occasionally observed in connection with my hydrogen-neutral ion mixture of U.S. patent application Ser. No. D-7650. On the other hand, I have found that the silicon tetrachloride reactant gas does not have a selectivity quite as good as that of my hydrogen-neutral ion mixture. Moreover, the silicon tetrachloride gas may be a little corrosive on the vacuum system. Accordingly, even though it is somewhat faster, there are other considerations that may prompt one to want to use a hydrogen-nitrogen mixture, for example, instead of silicon tetrachloride when etching tin oxide.

In addition, 100% by volume silicon tetrachloride is a preferred reactant gas of the instant invention. On the other hand, I recognize that one might choose to use less than about 100% by volume silicon tetrachloride. Perhaps one might be able to dilute it with another gas, as for example nitrogen, argon, xenon and/or krypton. I have not attempted to do so, but recognize that it might be possible under certain circumstances. However, in accordance with this invention I would prefer that the reactant gas consist essentially of silicon tetrachloride. Dilution with the neutral gas would probably slow down etching rates, and perhaps introduce other problems.

The embodiments of the invention in which an exclusive property or privilege is claimed are defined as follows:

1. In a method of reactive ion etching, the improvement wherein tin oxide is reactive ion etched using a reactant gas consisting essentially of silicon tetrachloride, whereby the tin oxide is highly uniformly etched and without producing a residue that must be removed in a following step.

2. A one-step process for the etching of high resolution patterns in tin oxide films comprising the step of reactively ion etching a tin oxide film with a reactant gas consisting essentially of silicon tetrachloride.

* * * * *